United States Patent
Deng

(10) Patent No.: US 10,217,778 B2
(45) Date of Patent: Feb. 26, 2019

(54) ARRAY SUBSTRATE AND MANUFACTURING METHOD THEREOF

(71) Applicant: Shenzhen China Star Optoelectronics Technology Co., Ltd., Shenzhen (CN)

(72) Inventor: Yong Deng, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 160 days.

(21) Appl. No.: 15/121,039

(22) PCT Filed: Jul. 15, 2016

(86) PCT No.: PCT/CN2016/090105
§ 371 (c)(1),
(2) Date: Aug. 24, 2016

(87) PCT Pub. No.: WO2017/219411
PCT Pub. Date: Dec. 28, 2017

(65) Prior Publication Data
US 2018/0197900 A1 Jul. 12, 2018

(30) Foreign Application Priority Data
Jun. 22, 2016 (CN) .......................... 2016 1 0459122

(51) Int. Cl.
*H01L 27/12* (2006.01)
*H01L 21/4763* (2006.01)
(Continued)

(52) U.S. Cl.
CPC ........ *H01L 27/1288* (2013.01); *G02F 1/1362* (2013.01); *G02F 1/1368* (2013.01);
(Continued)

(58) Field of Classification Search
CPC ............. H01L 29/7869; H01L 27/1225; H01L 27/124; H01L 29/66969; H01L 29/24
(Continued)

(56) References Cited

U.S. PATENT DOCUMENTS

2006/0060890 A1* 3/2006 You ................... G02F 1/133555
257/222
2010/0072468 A1* 3/2010 Yamazaki .......... G02F 1/13458
257/43
(Continued)

FOREIGN PATENT DOCUMENTS

CN 102543863 A 7/2012

*Primary Examiner* — Jonathan Han
(74) *Attorney, Agent, or Firm* — Leong C. Lei

(57) ABSTRACT

The present invention provides an array substrate and a manufacturing method thereof. The method includes covering a reduction metal layer on an oxide semiconductor layer film and simultaneously forming a source pattern, a drain pattern, a pixel electrode pattern, and an oxide semiconductor layer through patterning the oxide semiconductor layer film and the reduction metal layer with one mask-based operation, followed by reducing the source pattern, the drain pattern, and the pixel electrode pattern to conductors through laser annealing to simultaneously form a source electrode, a drain electrode, and a pixel electrode. The entire manufacturing process needs, at most, only three rounds of mask-based operations so that, compared to the prior art, the number of mask-based operations required can be effectively reduced, the manufacturing operation can be simplified, and the performance of a TFT can be improved and an aperture ratio of the array substrate can be increased.

14 Claims, 8 Drawing Sheets

(51) Int. Cl.

| | |
|---|---|
| *H01L 21/467* | (2006.01) |
| *H01L 29/45* | (2006.01) |
| *H01L 29/24* | (2006.01) |
| *G02F 1/1368* | (2006.01) |
| *H01L 21/027* | (2006.01) |
| *H01L 21/77* | (2017.01) |
| *G02F 1/1343* | (2006.01) |
| *H01L 21/02* | (2006.01) |
| *H01L 29/423* | (2006.01) |
| *H01L 29/66* | (2006.01) |
| *H01L 29/786* | (2006.01) |
| *G02F 1/1362* | (2006.01) |

(52) U.S. Cl.
CPC ........ *G02F 1/13439* (2013.01); *H01L 21/027* (2013.01); *H01L 21/02565* (2013.01); *H01L 21/467* (2013.01); *H01L 21/47635* (2013.01); *H01L 21/77* (2013.01); *H01L 27/12* (2013.01); *H01L 27/127* (2013.01); *H01L 27/1225* (2013.01); *H01L 29/24* (2013.01); *H01L 29/42384* (2013.01); *H01L 29/45* (2013.01); *H01L 29/66969* (2013.01); *H01L 29/7869* (2013.01); *H01L 29/78618* (2013.01); *G02F 1/134363* (2013.01); *G02F 2001/134372* (2013.01); *G02F 2001/136231* (2013.01); *G02F 2201/123* (2013.01); *G02F 2202/10* (2013.01)

(58) Field of Classification Search
USPC ............... 257/43, 59, 72; 438/104, 158, 151
See application file for complete search history.

(56) References Cited

U.S. PATENT DOCUMENTS

| | | | |
|---|---|---|---|
| 2012/0138932 A1* | 6/2012 | Lin | G02F 1/136213 257/59 |
| 2013/0187164 A1* | 7/2013 | Oshima | H01L 29/78693 257/59 |
| 2013/0200383 A1* | 8/2013 | Jia | H01L 27/124 257/66 |
| 2015/0162358 A1* | 6/2015 | Inoue | H01L 27/1225 257/43 |

\* cited by examiner

ARRAY SUBSTRATE AND MANUFACTURING METHOD THEREOF

BACKGROUND OF THE INVENTION

1. Field of the Invention

The present invention relates to the field of display technology, and in particular to an array substrate and a manufacturing method thereof.

2. The Related Arts

With the progress of the display technology, flat panel display devices, such as thin-film transistor liquid crystal displays (TFT-LCDs), due to various advantages, such as high image quality, low power consumption, thin device body, and wide range of applications, have been widely used in all sorts of consumer electronic products, including mobile phones, televisions, personal digital assistants (PDAs), digital cameras, notebook computers, and desktop computers, making them the main stream of display devices.

Most of the liquid crystal display devices that are currently available in the market are backlighting LCDs, which comprise a liquid crystal display panel and a backlight module. The working principle of the liquid crystal display panel is that liquid crystal molecules are disposed between two parallel glass substrates and multiple vertical and horizontal tiny conductive wires are arranged between the two glass substrates, wherein the liquid crystal molecules are controlled to change directions through application of electricity in order to refract out light emitting from the backlight module to generate an image.

According to the way that liquid crystal is oriented, liquid crystal display panels that are in the main stream market can be classified in the following categories, including twisted nematic (TN) or super twisted nemaitc (STN), in-plane switching (IPS), fringe field switching (FFS), and vertical alignment (VA), among which IPS and FFS liquid crystal display panels are generally favored by consumers for advantages of wide viewing angle and high aperture ratio.

Referring to FIG. 1, FIG. 1 is a schematic view illustrating a conventional IPS array substrate that is suitable for small-sized display products. The IPS liquid crystal display panel comprises: a base plate 100, a first metal layer 200 arranged on the base plate 100, a gate insulation layer 300 arranged on the first metal layer 200, an active layer 400 arranged on the gate insulation layer 300, a second metal layer 600 and a pixel electrode 500 arranged on the active layer 400 and the gate insulation layer 300, an interlayer insulation layer 700 arranged on the second metal layer 600, the pixel electrode 500, and the gate insulation layer 300, and a common electrode 800 arranged on the interlayer insulation layer 700, wherein the first metal layer 200 comprises: a gate electrode of a TFT and a common electrode connection line and the second metal layer 600 comprises: a data line, a source electrode of the TFT, and a drain electrode of the TFT. The pixel electrode 500 is in connection with the drain electrode of the TFT. The common electrode 800 is connected, through a via formed in the interlayer insulation layer 700 and the gate insulation layer 300, to the common electrode connection line, wherein the common electrode 800 is a patterned electrode, which comprises a plurality of electrode strips that is parallel to and spaced from each other, while the pixel electrode 500 is a planar electrode of an entire block. Referring to FIG. 2, FIG. 2 is a schematic view illustrating a conventional IPS array substrate that is suitable for large-sized display products. The IPS liquid crystal display panel comprises: a base plate 100', a common electrode 800' arranged on the base plate 100', a first metal layer 200' arranged on the base plate 100' and the common electrode 800', a gate insulation layer 300' arranged on the first metal layer 200', an active layer 400' arranged on the gate insulation layer 300', a second metal layer 600' arranged on the active layer 400' and the gate insulation layer 300', an interlayer insulation layer 700' arranged on the second metal layer 600' and the gate insulation layer 300', and a pixel electrode 500' arranged on the interlayer insulation layer 700', wherein the first metal layer 200' comprises: a common electrode connection line arranged on the common electrode 800' and a gate electrode of a TFT that is arranged on the base plate 100' and the second metal layer 600' comprises: a data line, a source electrode of the TFT, and a drain electrode of the TFT. The pixel electrode 500' is connected, through a via extending through the interlayer insulation layer 700', to the drain electrode of the TFT. The pixel electrode 500' is a patterned electrode, which comprises a plurality of electrode strips that is parallel to and spaced from each other, while the common electrode 800' is a planar electrode of an entire block. The two IPS array substrates described above both comprise, in the manufacturing thereof, five to six rounds of mask-based operation, including patterning of a first metal layer, patterning of an active layer, patterning of a second metal layer, patterning of an pixel electrode or a common electrode, and patterning of an interlayer insulation layer and a gate insulation layer, and thus, the manufacturing operations are complicated, the manufacturing costs are high, and the manufacturing efficiencies are low.

SUMMARY OF THE INVENTION

An object of the present invention is to provide a manufacturing method of an array substrate, which simplifies a manufacturing operation of the array substrate, reduces the number of masks used, improves the performance of thin-film transistors (TFTs), and increases the aperture ratio.

Another object of the present invention is to provide an array substrate, which helps improve the performance and the aperture ratio of the array substrate.

To achieve the above objects, the present invention provides a manufacturing method of an array substrate, which comprises the following steps:

(1) providing a base plate, depositing a common electrode film on the base plate, and depositing a first metal layer on the common electrode film;

(2) applying a first mask-based operation to pattern the common electrode film and the first metal layer so as to form a common electrode and a gate electrode and a common electrode connection line located on the common electrode;

(3) depositing, in sequence from bottom to top, a gate insulation layer, an oxide semiconductor layer film, and a reduction metal layer on the base plate, the common electrode, the gate electrode, and the common electrode connection line;

(4) applying a second mask-based operation to pattern the oxide semiconductor layer film and the reduction metal layer to form a source pattern, a drain pattern, and a pixel electrode pattern, which are to be reduced, and an oxide semiconductor layer, wherein the oxide semiconductor layer is located on the gate electrode; the source pattern and the drain pattern are arranged, in a manner of being spaced from each other, at two ends of the oxide semiconductor layer and in connection with the oxide semiconductor layer; the drain pattern is in connection with the pixel electrode pattern; and the source pattern, the drain pattern, and the pixel electrode pattern which are to be reduced, each comprise a part of the oxide semiconductor layer film and a part of the reduction metal layer stacked in sequence from bottom to top;

(5) conducting laser annealing on the source pattern, the drain pattern, and the pixel electrode pattern, which are to be reduced, to have the source pattern, the drain pattern, and the pixel electrode pattern reduced to conductors for forming a source electrode, a drain electrode, and a pixel electrode; and (6) depositing a passivation layer on the source electrode, the drain electrode, the pixel electrode, the oxide semiconductor layer, and the gate insulation layer to complete manufacturing of the array substrate.

The reduction metal layer is formed of a material comprising manganese or aluminum.

The reduction metal layer has a thickness less than 100 Å.

The oxide semiconductor layer film is formed of a material comprising indium gallium zinc oxide (IGZO).

The first mask-based operation involved in step (1) and the second mask-based operation involved in step (4) are both half tone mask plates.

The manufacturing method of the array substrate is applicable to manufacturing an in-plane switching (IPS) array substrate or a fringe field switching (FFS) array substrate.

Step (5) further comprises: depositing a second metal layer on the source electrode, the drain electrode, the pixel electrode, the oxide semiconductor layer, and the gate insulation layer; and applying a third mask-based operation to pattern the second metal layer to form a source assisting metal located on the source electrode; and wherein in step (6), the passivation layer covers the source assisting metal.

The present invention also provides an array substrate, which comprises: a base plate, a common electrode arranged on the base plate, a gate electrode and a common electrode connection line arranged on the common electrode, a gate insulation layer set on and covering the base plate, the common electrode, the gate electrode, and the common electrode connection line, an oxide semiconductor layer arranged on the gate insulation layer and located above the gate electrode, a source electrode, a drain electrode, and a pixel electrode arranged on the gate insulation layer, and a passivation layer set on and covering the source electrode, the drain electrode, the pixel electrode, the oxide semiconductor layer, and the gate insulation layer;

wherein the source electrode and the drain electrode are arranged, in a manner of being spaced from each other, at two ends of the oxide semiconductor layer and in connection with the oxide semiconductor layer and the drain electrode is in connection with the pixel electrode.

The array substrate further comprises a source assisting metal arranged on the source electrode and the passivation layer covers the source assisting metal.

The source electrode, the drain electrode, and the pixel electrode are formed by reduction of an oxide semiconductor material with a reduction metal.

The present invention further provides a manufacturing method of an array substrate, which comprising the following steps:

(1) providing a base plate, depositing a common electrode film on the base plate, and depositing a first metal layer on the common electrode film;

(2) applying a first mask-based operation to pattern the common electrode film and the first metal layer so as to form a common electrode and a gate electrode and a common electrode connection line located on the common electrode;

(3) depositing, in sequence from bottom to top, a gate insulation layer, an oxide semiconductor layer film, and a reduction metal layer on the base plate, the common electrode, the gate electrode, and the common electrode connection line;

(4) applying a second mask-based operation to pattern the oxide semiconductor layer film and the reduction metal layer to form a source pattern, a drain pattern, and a pixel electrode pattern, which are to be reduced, and an oxide semiconductor layer, wherein the oxide semiconductor layer is located on the gate electrode; the source pattern and the drain pattern are arranged, in a manner of being spaced from each other, at two ends of the oxide semiconductor layer and in connection with the oxide semiconductor layer; the drain pattern is in connection with the pixel electrode pattern; and the source pattern, the drain pattern, and the pixel electrode pattern which are to be reduced, each comprise a part of the oxide semiconductor layer film and a part of the reduction metal layer stacked in sequence from bottom to top;

(5) conducting laser annealing on the source pattern, the drain pattern, and the pixel electrode pattern, which are to be reduced, to have the source pattern, the drain pattern, and the pixel electrode pattern reduced to conductors for forming a source electrode, a drain electrode, and a pixel electrode; and (6) depositing a passivation layer on the source electrode, the drain electrode, the pixel electrode, the oxide semiconductor layer, and the gate insulation layer to complete manufacturing of the array substrate;

wherein the reduction metal layer is formed of a material comprising manganese or aluminum; and wherein the reduction metal layer has a thickness less than 100 Å.

The efficacy of the present invention is that the present invention provides a manufacturing method of an array substrate, which comprises a reduction metal layer set on and covering an oxide semiconductor layer film and allows for simultaneously forming a source pattern, a drain pattern, a pixel electrode pattern, and an oxide semiconductor layer through patterning the oxide semiconductor layer film and the reduction metal layer with one mask-based operation, followed by reducing the source pattern, the drain pattern, and the pixel electrode pattern to conductors through laser annealing to simultaneously form a source electrode, a drain electrode, and a pixel electrode. The entire manufacturing process needs, at most, only three rounds of mask-based operations so that, compared to the prior art, the number of mask-based operations required can be effectively reduced, the manufacturing operation can be simplified, and the performance of a TFT can be improved and an aperture ratio of the array substrate can be increased. The present invention also provides an array substrate, which has improved performance and a high aperture ratio.

BRIEF DESCRIPTION OF THE DRAWINGS

The features and technical contents of the present invention will be better understood by referring to the following detailed description and drawings the present invention. However, the drawings are provided for the purpose of reference and illustration and are not intended to limit the scope of the present invention.

In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
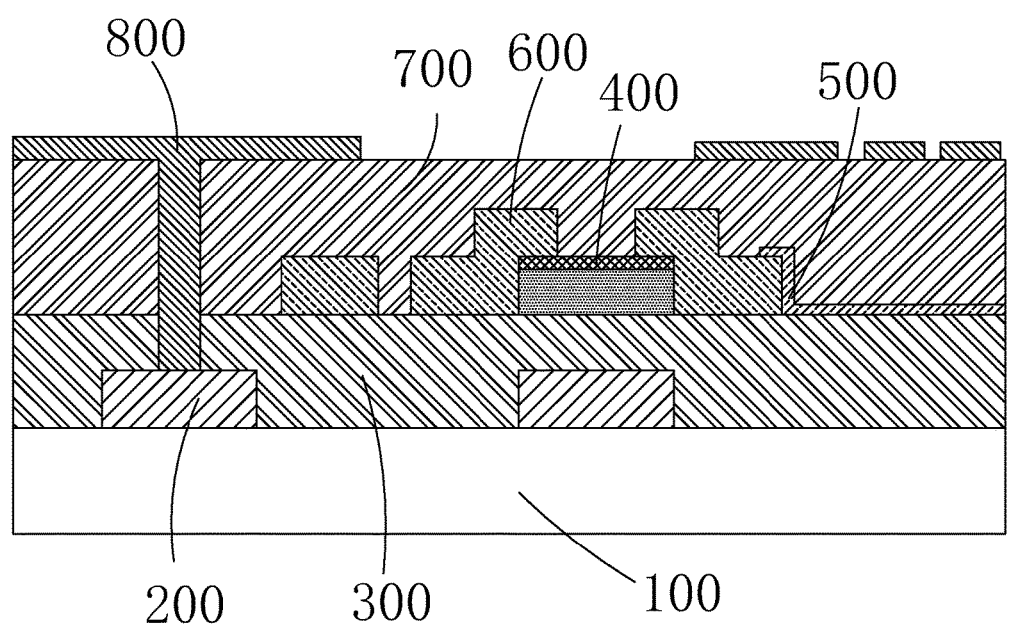
FIG. 1 is a schematic view illustrating a conventional IPS array substrate that is suitable for small-sized display products.
Figure 2:
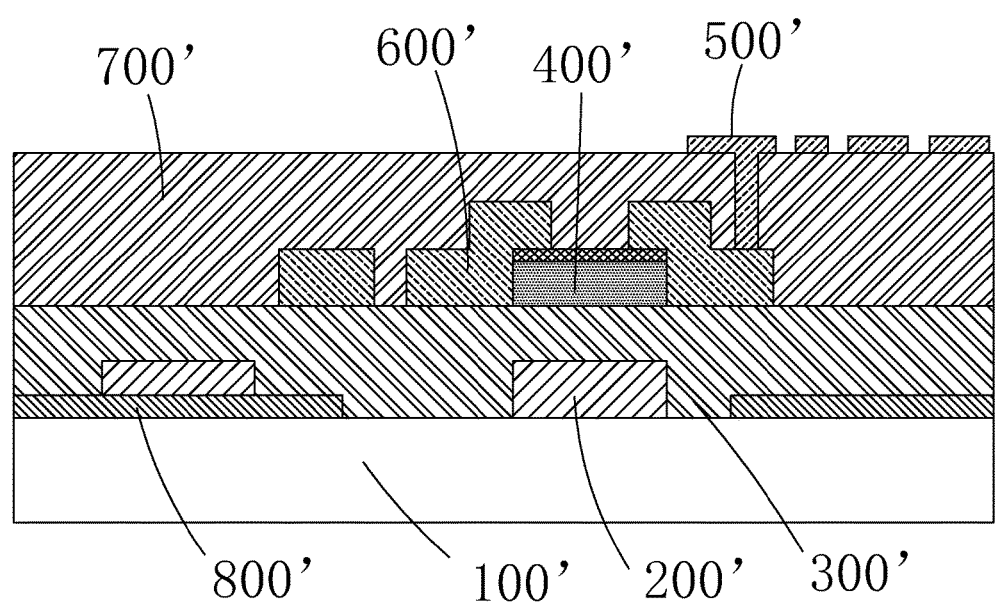
FIG. 2 is a schematic view illustrating a conventional IPS array substrate that is suitable for large-sized display products.
Figure 3:
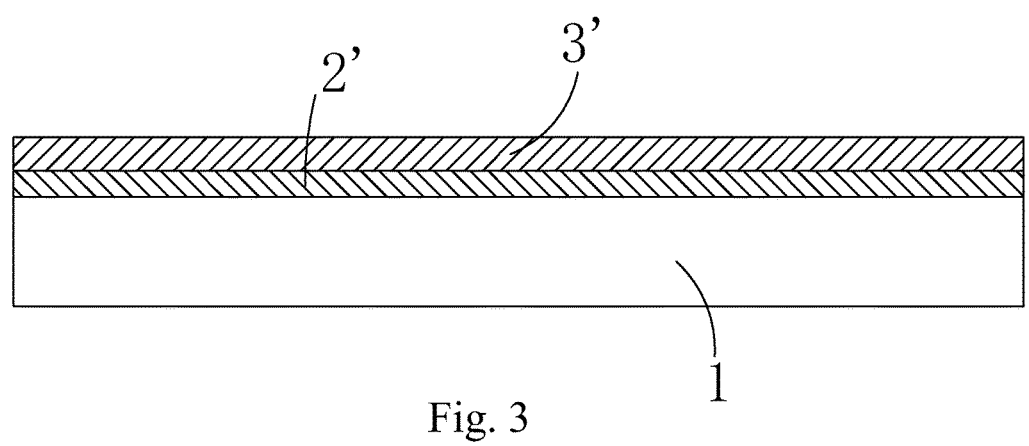
FIG. 3 is a schematic view illustrating step 1 of a manufacturing method of an array substrate according to the present invention.
Figure 11:
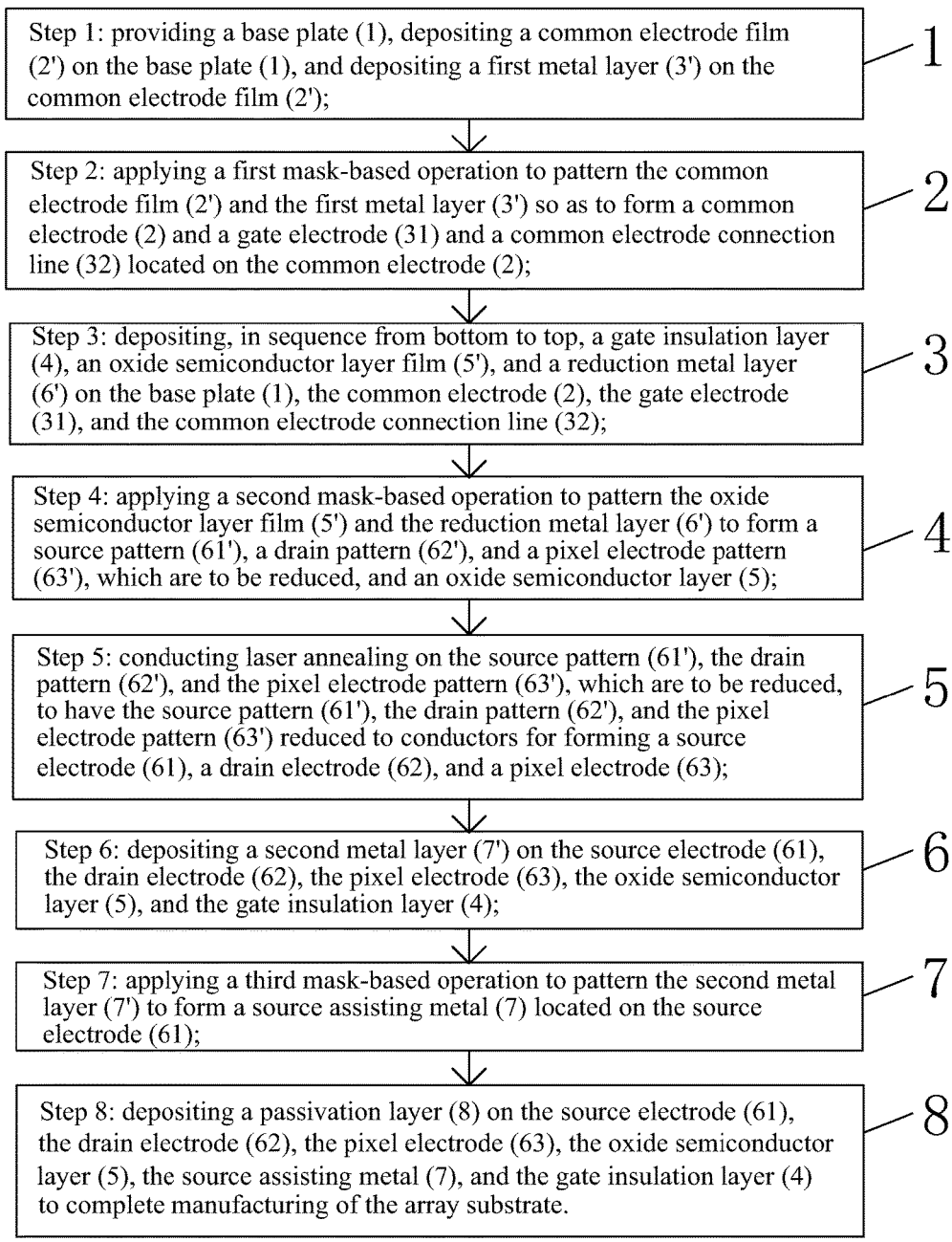
FIG. 11 is a flow chart illustrating the manufacturing method of an array substrate according to a preferred embodiment of the present invention.

Referring to FIG. 11, the present invention provides a manufacturing method of an array substrate. The manufacturing method, which is generally applicable to manufacturing of in-plane switching (IPS) array substrates or fringe field switching (FFS) array substrates to simplify a manufacturing process of the IPS array substrates or FFS array substrates, comprises the following steps:

Step 1: referring to FIG. 3, providing a base plate 1, depositing a common electrode film 2' on the base plate 1, and depositing a first metal layer 3' on the common electrode film 2'.

Specifically, the base plate 1 comprises a transparent plate, preferably a glass plate; the common electrode film 2' is formed of a material comprising a transparent conductive oxide (TCO) material; and the first metal layer 3' is formed of a material comprising molybdenum (Mo).

Figure 4:
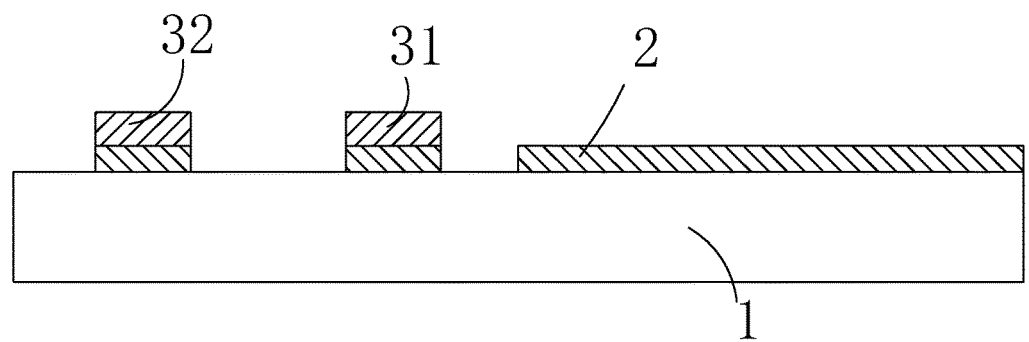
FIG. 4 is a schematic view illustrating step 2 of the manufacturing method of an array substrate according to the present invention.

Step 2: referring to FIG. 4, applying a first mask-based operation to pattern the common electrode film 2' and the first metal layer 3' so as to form a common electrode 2 and a gate electrode 31 and a common electrode connection line 32 located on the common electrode 2.

Specifically, Step 2 uses a half tone mask plate to conduct the first mask-based operation so as to completely remove the common electrode film 2' and the first metal layer 3' in one partial area and to remove only the first metal layer 3' in another partial area. The common electrode 2 is a planar electrode of an entire block. The common electrode connection line 32 that is arranged on the common electrode 2 helps improve electrical conductivity of the array substrate and increases signal transmission speed of the array substrate.

Figure 5:
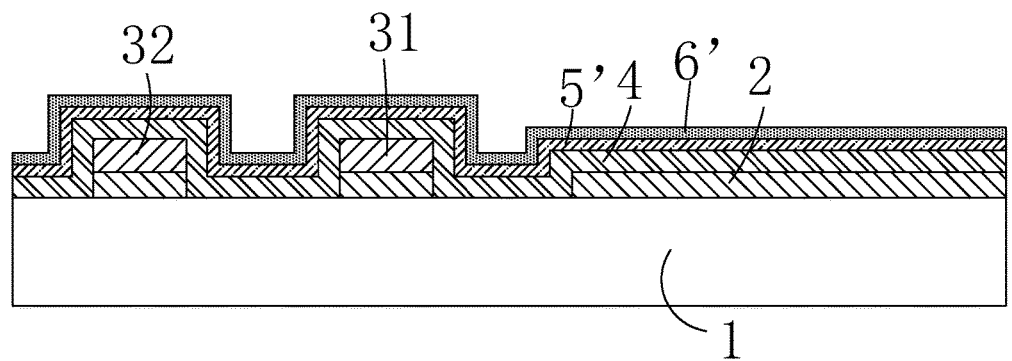
FIG. 5 is a schematic view illustrating step 3 of the manufacturing method of an array substrate according to the present invention.

Step 3: referring to FIG. 5, depositing, in sequence from bottom to top, a gate insulation layer 4, an oxide semiconductor layer film 5', and a reduction metal layer 6' on the base plate 1, the common electrode 2, the gate electrode 31, and the common electrode connection line 32.

Specifically, the gate insulation layer 4 is formed of a material comprising one of silicon oxide ($SiO_x$) and silicon nitride ($SiN_x$) or a stacked combination of multiple ones thereof; the oxide semiconductor layer film 5' is formed of a material comprising a transparent material, preferably indium gallium zinc oxide (IGZO); and the reduction metal layer 6' is formed of a material comprising a metallic material of high reducibility, preferably aluminum (Al) or manganese (Mn).

Figure 6:
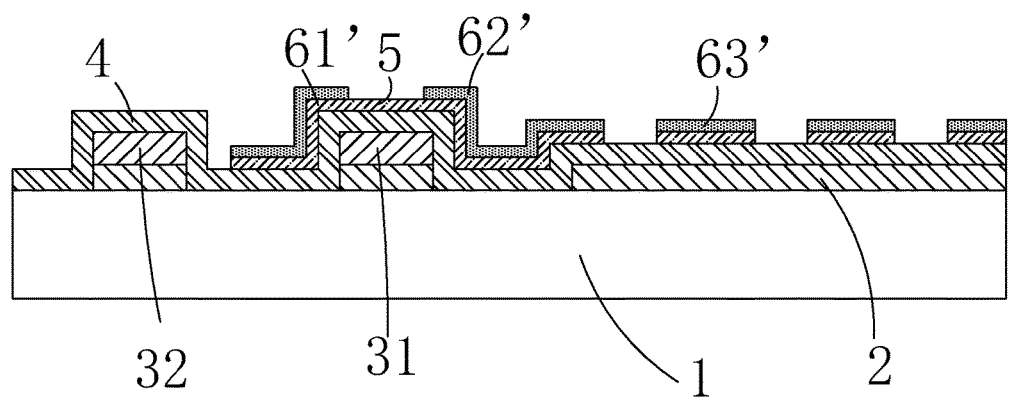
FIG. 6 is a schematic view illustrating step 4 of the manufacturing method of an array substrate according to the present invention.

Step 4: referring to FIG. 6, applying a second mask-based operation to pattern the oxide semiconductor layer film 5' and the reduction metal layer 6' to form a source pattern 61', a drain pattern 62', and a pixel electrode pattern 63', which are to be reduced, and an oxide semiconductor layer 5.

The oxide semiconductor layer 5 is located on the gate electrode 31. The source pattern 61' and the drain pattern 62' are arranged, in a manner of being spaced from each other, at two ends of the oxide semiconductor layer 5 and in connection with the oxide semiconductor layer 5. The drain pattern 62' is in connection with the pixel electrode pattern 63'. The source pattern 61', the drain pattern 62', and the pixel electrode pattern 63', which are to be reduced, each comprise a part of the oxide semiconductor layer film 5' and a part of the reduction metal layer 6' stacked in sequence from bottom to top.

Specifically, Step 4 uses a half tone mask plate to conduct the second mask-based operation so as to completely remove the oxide semiconductor layer film 5' and the reduction metal layer 6' in a partial area to form the source pattern 61', the drain pattern 62', and the pixel electrode pattern 63' and to remove only the reduction metal layer 6' in another partial area to form the oxide semiconductor layer 5. Compared to the prior art, Step 4 combines mask-based operations for a source electrode, a drain electrode, and a pixel electrode together so as to reduce the number of masks used and simplify the manufacturing operation.

Particularly, the reduction metal layer 6' has a thickness that is small (less than 100 Å) and is not capable of forming a thin film so as not to affect a light transmission property of the array substrate and may help, through proper treatment, to reduce a portion of the oxide semiconductor layer 5' that is in contact therewith to a conductor.

Figure 7:
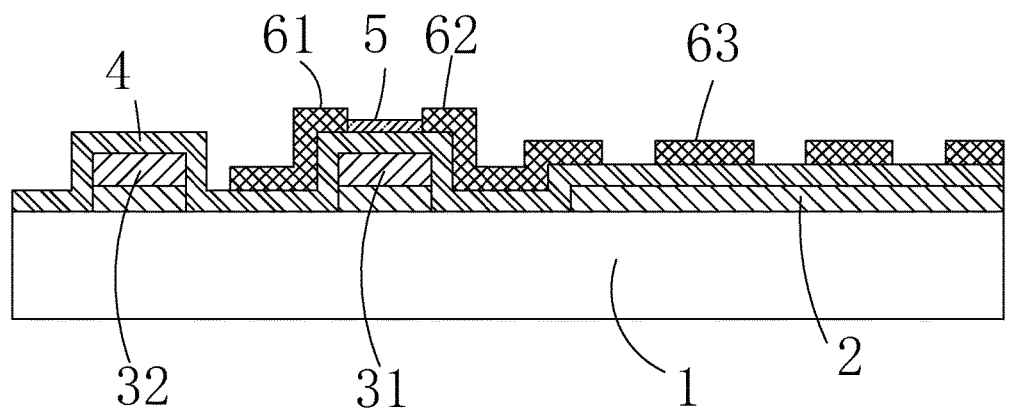
FIG. 7 is a schematic view illustrating step 5 of the manufacturing method of an array substrate according to the present invention.

Step 5: referring to FIG. 7, conducting laser annealing on the source pattern 61', the drain pattern 62', and the pixel electrode pattern 63', which are to be reduced, to have the source pattern 61', the drain pattern 62', and the pixel electrode pattern 63' reduced to conductors for forming a source electrode 61, a drain electrode 62, and a pixel electrode 63.

Specifically, the pixel electrode 63 is in the form of a patterned electrode, which comprises a plurality of parallel and spaced electrode strips for cooperating with the common electrode 2 to generate horizontal electric fields. The source electrode 61 and the drain electrode 62 are obtained through direct reduction of portions of the oxide semiconductor layer film 5' and may improve performance of a thin-film transistor (TFT) and increase an aperture ratio of the array substrate.

Figure 8:
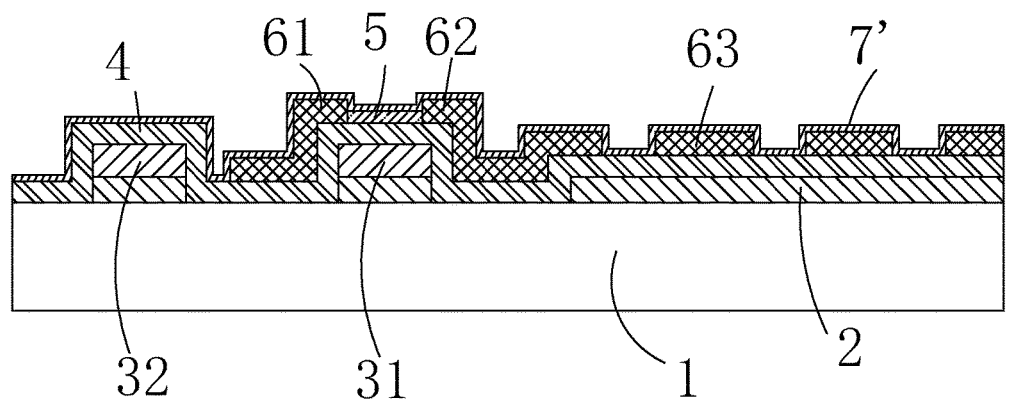
FIG. 8 is a schematic view illustrating step 6 of the manufacturing method of an array substrate according to the present invention.

Step 6: referring to FIG. 8, depositing a second metal layer 7' on the source electrode 61, the drain electrode 62, the pixel electrode 63, the oxide semiconductor layer 5, and the gate insulation layer 4.

Specifically, the second metal layer 7' is formed of a material comprising molybdenum and the second metal layer 7' is formed with a physical vapor deposition operation.

Figure 9:
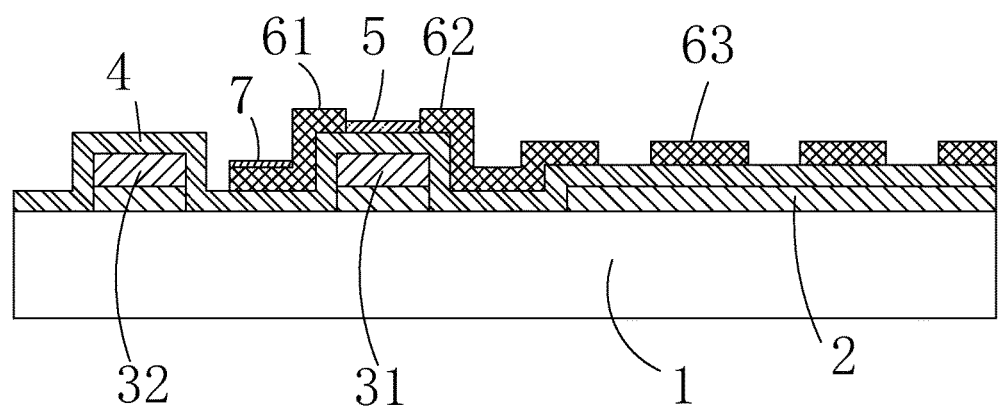
FIG. 9 is a schematic view illustrating step 7 of the manufacturing method of an array substrate according to the present invention.

Step 7: referring to FIG. 9, applying a third mask-based operation to pattern the second metal layer 7' so as to form a source assisting metal 7 located on the source electrode 61.

Specifically, the source assisting metal 7 functions to reduce resistance of the source electrode 61 and improve conductivity of the source electrode 61 in order to facilitate long distance transmission of signals, this being more prominent for large-sized display panels.

Figure 10:
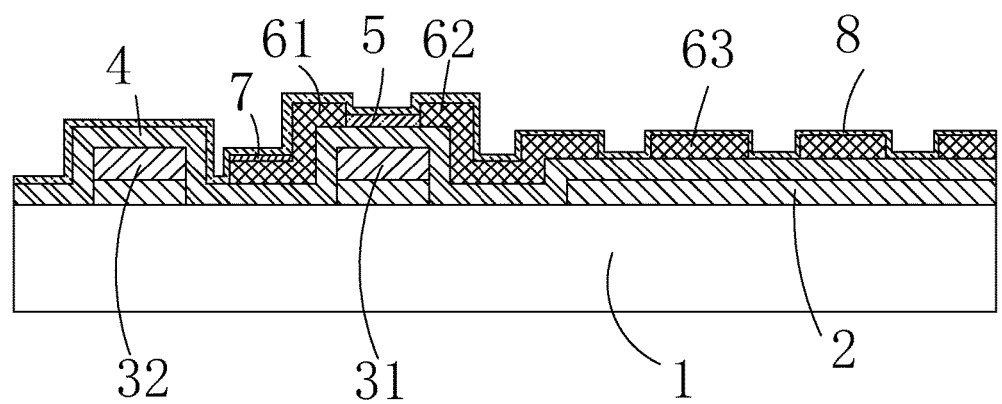
FIG. 10 is a schematic view illustrating step 8 of the manufacturing method of an array substrate according to the present invention and is also a schematic view illustrating the structure of an array substrate according to the present invention.

Step 8: referring to FIG. 10, depositing a passivation layer 8 on the source electrode 61, the drain electrode 62, the pixel electrode 63, the oxide semiconductor layer 5, the source assisting metal 7, and the gate insulation layer 4 to complete manufacturing of the array substrate.

Specifically, the passivation layer 8 is formed of a material comprising one of silicon oxide and silicon nitride or a stacked combination of multiple ones thereof.

Figure 12:
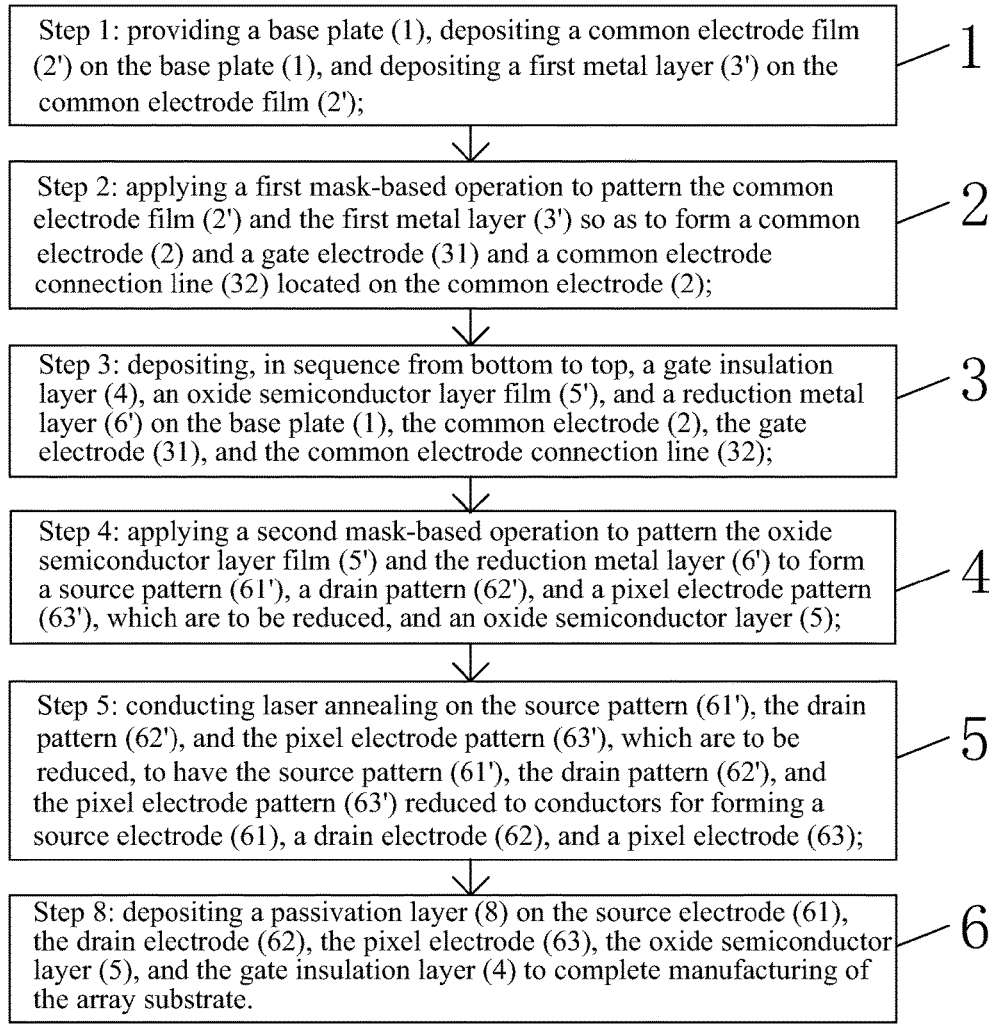
FIG. 12 is a flow chart illustrating the manufacturing method of an array substrate according to the present invention.

It can be appreciated, referring to FIG. 12, in other embodiments of the present invention, Steps 6 and 7 described above can be omitted, meaning no source assisting metal is formed. The embodiment of the present invention described above is one preferred way of embodiment and is not intended to limit the scope of the present invention.

Further, referring to FIG. 10, based on the above described manufacturing method of an array substrate, the present invention also provides an array substrate, which comprises: a base plate 1, a common electrode 2 arranged on the base plate 1, a gate electrode 31 and a common electrode connection line 32 arranged on the common electrode 2, a gate insulation layer 4 set on and covering the base plate 1, the common electrode 2, the gate electrode 31, and the common electrode connection line 32, an oxide semiconductor layer 5 arranged on the gate insulation layer 4 and located above the gate electrode 31, a source electrode 61, a drain electrode 62, and a pixel electrode 63 arranged on the gate insulation layer 4, and a passivation layer 8 set on and covering the source electrode 61, the drain electrode 62, the pixel electrode 63, the oxide semiconductor layer 5, and the gate insulation layer 4.

The source electrode 61 and the drain electrode 62 are arranged, in a manner of being spaced from each other, at two ends of the oxide semiconductor layer 5 and in connection with the oxide semiconductor layer 5. The drain electrode 62 is in connection with the pixel electrode 63.

Further, the array substrate also comprises a source assisting metal 7 arranged on the source electrode 61 and the passivation layer 8 is set on and covers the source assisting metal 7. The source assisting metal 7 functions to reduce resistance of the source electrode 61 and improve conductivity of the source electrode 61 in order to facilitate long distance transmission of signals, this being more prominent for large-sized display panels.

It is noted here that the source electrode 61, the drain electrode 62, and the pixel electrode 63 are formed through reduction of an oxide semiconductor material with a reduction metal so as to improve performance of a TFT and increase an aperture ratio of the array substrate. Further, the pixel electrode 63 is in the form of a patterned electrode, which comprises a plurality of parallel and spaced electrode strips for cooperating with the common electrode 2 to generate horizontal electric fields. In other words, the above-described array substrate may be used as an IPS array substrate or an FFS array substrate.

A material that makes the oxide semiconductor layer and an oxide semiconductor material that is reduced to form the source electrode 61, the drain electrode 62, and the pixel electrode 63 can both be selected to be IGZO.

In summary, the present invention provides a manufacturing method of an array substrate, which comprises a reduction metal layer set on and covering an oxide semiconductor layer film and allows for simultaneously forming a source pattern, a drain pattern, a pixel electrode pattern, and an oxide semiconductor layer through patterning the oxide semiconductor layer film and the reduction metal layer with one mask-based operation, followed by reducing the source pattern, the drain pattern, and the pixel electrode pattern to conductors through laser annealing to simultaneously form a source electrode, a drain electrode, and a pixel electrode. The entire manufacturing process needs, at most, only three rounds of mask-based operations so that, compared to the prior art, the number of mask-based operations required can be effectively reduced, the manufacturing operation can be simplified, and the performance of a TFT can be improved and an aperture ratio of the array substrate can be increased. The present invention also provides an array substrate, which has improved performance and a high aperture ratio.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of an array substrate, comprising the following steps:
   (1) providing a base plate, depositing a common electrode film on the base plate, and depositing a first metal layer on the common electrode film;
   (2) applying a first mask-based operation to pattern the common electrode film and the first metal layer so as to form a common electrode and a gate electrode and a common electrode connection line located on the common electrode;
   (3) depositing, in sequence from bottom to top, a gate insulation layer, an oxide semiconductor layer film, and a reduction metal layer on the base plate, the common electrode, the gate electrode, and the common electrode connection line;
   (4) applying a second mask-based operation to pattern the oxide semiconductor layer film and the reduction metal layer to form a source pattern, a drain pattern, and a pixel electrode pattern, which are to be reduced, and an oxide semiconductor layer,
   wherein the oxide semiconductor layer is located on the gate electrode; the source pattern and the drain pattern are arranged, in a manner of being spaced from each other, at two ends of the oxide semiconductor layer and in connection with the oxide semiconductor layer; the drain pattern is in connection with the pixel electrode pattern; and the source pattern, the drain pattern, and the pixel electrode pattern which are to be reduced, each comprise a part of the oxide semiconductor layer film and a part of the reduction metal layer stacked in sequence from bottom to top, wherein the part of the oxide semiconductor layer film entirely corresponds, in size and shape, to the part of the reduction metal layer;

(5) conducting laser annealing on the source pattern, the drain pattern, and the pixel electrode pattern, which are to be reduced, to have the source pattern, the drain pattern, and the pixel electrode pattern reduced to conductors for forming a source electrode, a drain electrode, and a pixel electrode, wherein the part of the oxide semiconductor layer film of each of the source pattern, the drain pattern, and the pixel electrode pattern to be reduced is converted through reduction by the part of the reduction metal layer to which the part of the oxide semiconductor layer film corresponds into the conductor in the form of a single layer corresponding, in size and shape, to the part of the reduction metal layer; and (6) depositing a passivation layer on the source electrode, the drain electrode, the pixel electrode, the oxide semiconductor layer, and the gate insulation layer to complete manufacturing of the array substrate.

2. The manufacturing method of the array substrate as claimed in claim 1, wherein the reduction metal layer is formed of a material comprising manganese or aluminum.

3. The manufacturing method of the array substrate as claimed in claim 1, wherein the reduction metal layer has a thickness less than 100 Å.

4. The manufacturing method of the array substrate as claimed in claim 1, wherein the oxide semiconductor layer film is formed of a material comprising indium gallium zinc oxide (IGZO).

5. The manufacturing method of the array substrate as claimed in claim 1, wherein the first mask-based operation involved in step (1) and the second mask-based operation involved in step (4) are both half tone mask plates.

6. The manufacturing method of the array substrate as claimed in claim 1, wherein the manufacturing method of the array substrate is applicable to manufacturing an in-plane switching (IPS) array substrate or a fringe field switching (FFS) array substrate.

7. The manufacturing method of the array substrate as claimed in claim 1, wherein step (5) further comprises: depositing a second metal layer on the source electrode, the drain electrode, the pixel electrode, the oxide semiconductor layer, and the gate insulation layer; and applying a third mask-based operation to pattern the second metal layer to form a source assisting metal located on the source electrode; and wherein in step (6), the passivation layer covers the source assisting metal.

8. An array substrate, comprising: a base plate, a common electrode arranged on the base plate, a gate electrode and a common electrode connection line arranged on the common electrode, a gate insulation layer set on and covering the base plate, the common electrode, the gate electrode, and the common electrode connection line, an oxide semiconductor layer arranged on the gate insulation layer and located above the gate electrode, a source electrode, a drain electrode, and a pixel electrode arranged on the gate insulation layer, and a passivation layer set on and covering the source electrode, the drain electrode, the pixel electrode, the oxide semiconductor layer, and the gate insulation layer;

wherein the source electrode and the drain electrode are arranged, in a manner of being spaced from each other, at two ends of the oxide semiconductor layer and in connection with the oxide semiconductor layer and the drain electrode is in connection with the pixel electrode; and wherein each of the source electrode, the drain electrode, and the pixel electrode comprises a layer of an oxide semiconductor material and a layer of a reduction metal stacked on the layer of the oxide semiconductor material such that each of the source electrode, the drain electrode, and the pixel electrode comprises a conductor that is formed through reduction of the layer of the oxide semiconductor material with the layer of the reduction metal and corresponds, in size and shape, to the layer of the reduction metal.

9. The array substrate as claimed in claim 8 further comprising a source assisting metal arranged on the source electrode and the passivation layer covers the source assisting metal.

10. A manufacturing method of an array substrate, comprising the following steps:

(1) providing a base plate, depositing a common electrode film on the base plate, and depositing a first metal layer on the common electrode film;

(2) applying a first mask-based operation to pattern the common electrode film and the first metal layer so as to form a common electrode and a gate electrode and a common electrode connection line located on the common electrode;

(3) depositing, in sequence from bottom to top, a gate insulation layer, an oxide semiconductor layer film, and a reduction metal layer on the base plate, the common electrode, the gate electrode, and the common electrode connection line;

(4) applying a second mask-based operation to pattern the oxide semiconductor layer film and the reduction metal layer to form a source pattern, a drain pattern, and a pixel electrode pattern, which are to be reduced, and an oxide semiconductor layer, wherein the oxide semiconductor layer is located on the gate electrode; the source pattern and the drain pattern are arranged, in a manner of being spaced from each other, at two ends of the oxide semiconductor layer and in connection with the oxide semiconductor layer; the drain pattern is in connection with the pixel electrode pattern; and the source pattern, the drain pattern, and the pixel electrode pattern which are to be reduced, each comprise a part of the oxide semiconductor layer film and a part of the reduction metal layer stacked in sequence from bottom to top, wherein the part of the oxide semiconductor layer film entirely corresponds, in size and shape, to the part of the reduction metal layer;

(5) conducting laser annealing on the source pattern, the drain pattern, and the pixel electrode pattern, which are to be reduced, to have the source pattern, the drain pattern, and the pixel electrode pattern reduced to conductors for forming a source electrode, a drain electrode, and a pixel electrode, wherein the part of the oxide semiconductor layer film of each of the source pattern, the drain pattern, and the pixel electrode pattern to be reduced is converted through reduction by the part of the reduction metal layer to which the part of the oxide semiconductor layer film corresponds into the conductor in the form of a single layer corresponding, in size and shape, to the part of the reduction metal layer; and (6) depositing a passivation layer on the source electrode, the drain electrode, the pixel electrode, the oxide semiconductor layer, and the gate insulation layer to complete manufacturing of the array substrate;

wherein the reduction metal layer is formed of a material comprising manganese or aluminum; and wherein the reduction metal layer has a thickness less than 100 Å.

11. The manufacturing method of the array substrate as claimed in claim 10, wherein the oxide semiconductor layer film is formed of a material comprising indium gallium zinc oxide (IGZO).

12. The manufacturing method of the array substrate as claimed in claim 10, wherein the first mask-based operation involved in step (1) and the second mask-based operation involved in step (4) are both half tone mask plates.

13. The manufacturing method of the array substrate as claimed in claim 10, wherein the manufacturing method of the array substrate is applicable to manufacturing an in-plane switching (IPS) array substrate or a fringe field switching (FFS) array substrate.

14. The manufacturing method of the array substrate as claimed in claim 10, wherein step (5) further comprises: depositing a second metal layer on the source electrode, the drain electrode, the pixel electrode, the oxide semiconductor layer, and the gate insulation layer; and applying a third mask-based operation to pattern the second metal layer to form a source assisting metal located on the source electrode; and wherein in step (6), the passivation layer covers the source assisting metal.

* * * * *